United States Patent [19]
Furukawa et al.

[11] Patent Number: 5,568,148
[45] Date of Patent: Oct. 22, 1996

[54] ANALOG/DIGITAL CONVERSION CIRCUIT

[75] Inventors: Takehiro Furukawa; Eizo Yamashita; Nobuyuki Saiki, all of Itami, Japan

[73] Assignee: Mitsubishi Denki Kabushiki Kaisha, Tokyo, Japan

[21] Appl. No.: 336,698

[22] Filed: Nov. 7, 1994

[30] Foreign Application Priority Data

Nov. 8, 1993  [JP]  Japan .................................. 5-278554

[51] Int. Cl.⁶ ..................................................... H03M 1/12
[52] U.S. Cl. ........................................................ 341/155
[58] Field of Search ................................. 341/155, 156, 341/158, 161, 162

[56]  References Cited
U.S. PATENT DOCUMENTS 5,014,057  5/1991  Mintzer ................................... 341/161

FOREIGN PATENT DOCUMENTS 60-57734  12/1985  Japan .

Primary Examiner—Brian K. Young
Attorney, Agent, or Firm—Lowe, Price, LeBlanc & Becker

[57]  ABSTRACT

An analog/digital conversion circuit capable of digital conversion of an analog voltage higher than a reference voltage, by converting an excess of the analog voltage over the reference voltage in result of a comparison with a comparison voltage derived by dividing tile reference voltage, and by setting a digital value of one place up the highest digit place of the digital values obtained as a result of the comparison with the comparison voltage to be 1 (one).

5 Claims, 5 Drawing Sheets

ANALOG/DIGITAL CONVERSION CIRCUIT

BACKGROUND OF THE INVENTION

1. Field of the Invention

The present invention relates to an analog/digital conversion circuit capable of digital conversion of an analog voltage higher than a reference voltage.

2. Description of the Related Art

FIG. 1 is a block diagram showing the configuration of an analog/digital conversion circuit of the prior art disclosed, for example, in Japanese Patent Publication No. 60-57734 (1985). For convenience of explanation, the following description assumes that the resolution of this converter is 4 bits. Between a terminal 1 where a reference voltage $V_{ref}$ is applied, and a ground potential point 2, is interposed a series circuit consisting of a resistor $11_1$ with a resistance of 3R/2 (R is an appropriate resistance value), fourteen resistors $11_2$, through $11_{15}$ each with a resistance of R, and a resistor $11_{16}$ with a resistance of R/2. Divided voltages of the reference voltage $V_{ref}$ are obtained from nodes a through o along the series circuit of the resistors $11_1$ through $11_{16}$ as comparison voltages proportional to the number of resistors interposed between the reference voltage $V_{ref}$ and the respective nodes. The comparison voltages are supplied in parallel to an analog multiplexer 12 which selects three of the comparison voltages taken from the nodes a through o to output, in accordance with a selection code and digital code supplied from a control circuit 114 for the first and second comparisons as will be described later.

The three comparison voltages selected by the analog multiplexer 12 are respectively applied to first input terminals of comparators $13_1$ through $13_3$. An analog voltage $AN_{in}$ inputted via a terminal 3 is applied to the other input terminals of the comparators $13_1$ through $13_3$ in parallel. The comparators $13_1$ through $13_3$ output comparison result signals $C_1$, $C_2$, and $C_2$, respectively, which are supplied in parallel to the control circuit 114. In response to an analog/digital conversion start signal ST externally applied to a control input terminal 15, the control circuit 114 supplies a digital code (selection code) to the analog multiplexer 12 to select the comparison voltages to be used for the first comparison whereby the analog voltage $AN_{in}$ inputted via the terminal 3 for digital conversion is sorted into one of four voltage ranges that substantially quadrisect the potential difference between the reference voltage and the ground potential.

Further, the control circuit, 114 outputs a digital code according to the comparison result signals $C_1$ through $C_3$ supplied in parallel from the comparators $13_1$ through $13_3$, on receipt of the comparison result: signals $C_1$ through $C_3$; in the second comparison, this digital code is supplied as a selection code to the analog multiplexer 12, and when the second comparison is completed, it is supplied as it is, or with some of its values changed, depending on the result of the second comparison, as a digital conversion result to a latch circuit 16. The latch circuit 16 temporarily holds the digital code supplied from the control circuit 114, and then outputs the code via output terminals $17_1$ through $17_4$. At the completion of the analog/digital conversion, the control circuit 114 outputs a completion signal END via a control output terminal 18.

Table 1 shows the relationship between the comparison voltages obtained from the nodes a through o of the resistors $11_1$ through $11_{16}$ and the digital code values $2^{-1}$, $2^{-2}$, $2^{-4}$.

The operation of the conventional analog/digital conversion circuit will be described below witch reference to Table 1.

In resXonse to the conversion start signal ST applied to the control input terminal 15, the control circuit 114 automatically outputs to the analog multiplexer 12 for the first comparison, a 4-bit selection code, "$2^{-1}$, $2^{2-2}$, $2^{-3}$, $2^{-4}$"= "1100", corresponding to the node d out of the nodes d, h, and l that substantially quadrisect the potential difference between the reference voltage and the ground potential. When the digital code "1100" is inputted, the analog multiplexer 12 selects the comparison voltages $(23/32)V_{ref}$, $(15/32)V_{ref}$, and $(7/32)V_{ref}$ respectively taken from the node d corresponding to the digital code "1100", and the other two nodes h and l (not shown in FIG. 1), and respectively supplies the selected comparison voltages to the first input terminals of the comparators $13_1$ through $13_3$. When the analog voltage $AN_{in}$ to be converted into digital values is inputted to the other terminals of the comparators $13_1$ through $13_3$, the comparators $13_1$ through $13_3$ perform the first comparison of the analog voltage $AN_{in}$ with the respective comparison voltages, and supply the respective comparison result signals $C_1$ through $C_3$ to the control circuit 114.

When it is assumed that the comparators $13_1$ through $13_3$ output the comparison result signals $C_1$ through $C_3$ of the "1" level if the analog voltage $AN_{in}$ is higher than the respective comparison voltages, one of the following four states is obtained for the comparison result signals $C_1$ through $C_3$ according to whether the analog voltage $AN_{in}$ is higher than the respective comparison voltages.

(1) $C_1=C_2=C_3=$"1" level (2) $C_1=$"0" level, $C_2=C_3=$"1" level (3) $C_1=C_2=$"0" level, $C_3=$"1" level (4) $C_1=C_2=C_3=$"0" level First, we will describe the case where the result of the first comparison corresponds to the state (1). When the analog voltage $AN_{in}$ is higher than the comparison voltage $(23/32)V_{ref}$ taken at the node d, the control circuit 114 outputs to the analog multiplexer 12 for the second comparison, a 4-bit selection code "1111" corresponding to the node a out of the nodes a, b, and c that substantially quadrisect the potential difference between the reference voltage and the comparison voltage $(23/32)V_{ref}$ at the node d. When this digital code is inputted, the analog multiplexer 12 selects the comparison voltages $(29/32)V_{ref}$, $(27/32)V_{ref}$, and $(25/32)V_{ref}$ respectively taken from the node a corresponding to the digital code "1111", and the other two nodes b and c, and supplies the selected comparison voltages to the respective comparators $13_1$ through $13_3$.

Then, the comparators $13_1$ through $13_3$ perform the second comparison of the analog voltage $AN_{in}$ with the respective comparison voltages.

In the second comparison, as in the first comparison, one of the above four states is obtained for the comparison result signals $C_1$ through $C_3$ according to whether the analog voltage $AN_{in}$ is higher than the respective comparison voltages. As a result of the second comparison, if the comparison result signals $C_1$ through $C_3$ are all at the "1" level, the control circuit 114 determines that the analog voltage $AN_{in}$ is higher than the comparison voltage $(29/32)V_{ref}$ at the node a, and passes the digital code outputted at the start of the second comparison on to the latch circuit 16. The latch circuit 16 outputs the digital code "1111" via the terminals $17_1$ through $17_4$ as the conversion result of the analog voltage $AN_{in}$.

On the other hand, if $C_1$32 "0" level and $C_2=C_3=$"1" level as a result of the second comparison, the control circuit 114 determines that tile analog voltage $AN_{in}$ is lower than the comparison voltage $(29/32)V_{ref}$ at the node a, but higher than the comparison voltage $(27/32)V_{ref}$ at the node b, and changes the two digits of a low order, bit $2^{-3}$ and bit $2^{-4}$, of the digital code outputted at the start of the second comparison, to "10"; the thus changed digital code is supplied to the latch circuit 16. The latch circuit 16 outputs the digital code "1110" via the terminals $17_1$ through $17_4$ as the conversion result of the analog voltage $AN_{in}$.

Further, if $C_1=C_2$ ="0" level and $C_3=$"1" level as a result of the second comparison, the control circuit 114 determines that the analog voltage $AN_{in}$ is lower than the comparison voltage $(27/32)V_{ref}$ at the node b, but higher than the comparison voltage $(25/32)V_{ref}$ at the node c, and changes the two digits of a low order, bit $2^{-3}$ and bit $2^{-4}$, of the digital code outputted at the start of the second comparison, to "01"; the thus changed digital code is supplied to the latch circuit 16. The latch circuit 16 outputs the digital code "1101" via the terminals $17_1$ through $17_4$ as the conversion result of the analog voltage $AN_{in}$.

If $C_1=C_2=C_3=$"0" level as a result of the second comparison, the control circuit 114 determines that, the analog voltage $AN_{in}$ is lower than the comparison voltage $(25/32)V_{ref}$ at the node c, but higher than the comparison voltage $(23/32)V_{ref}$ at the node d, and changes the two digits of a low order, bit, $2^{-3}$ and bit $2^{-4}$, of the digital code outputted at the start of the second comparison, to "00" ; the thus changed digital code is supplied to the latch circuit 16. The latch circuit, 16 outputs the digital code "1100" via the terminals $17_1$ through $17_4$ as the conversion result of the analog voltage $AN_{in}$.

Next, we will describe the case where the result of the first comparison corresponds to the state (2). When $C_1=$"0" level and $C_2=$"1" level, that is, when the analog voltage $AN_{in}$ is lower than the comparison voltage $(23/32)V_{ref}$ at the node d, but higher than the comparison voltage $(15/32)V_{ref}$ at the node h, the control circuit 114 outputs to the analog multiplexer 12 for the second comparison, a 4-bit selection code "1011" corresponding to the node e out of the nodes e, f, and g that substantially quadrisect the potential difference between the comparison voltage $(23/32)V_{ref}$ at the node d and the comparison voltage $(15/32)V_{ref}$ at the node h. When this digital code is inputted, the analog multiplexer 12 selects the comparison voltages $(21/32)V_{ref}$, $(19/32)V_{ref}$, and $(17/32)V_{ref}$ respectively taken from the node e corresponding to the digital code "1011", and the other two nodes f and g, and supplies the selected comparison voltages to the respective comparators $13_1$ through $13_3$.

Then, the comparators $13_1$ through $13_3$ perform the second comparison of the analog voltage $AN_{in}$ with the respective comparison voltages.

As a result of the second comparison, if the comparison result signals $C_1$ through $C_3$ are all at the "1" level, the control circuit 114 determines that the analog voltage $AN_{in}$ is higher than the comparison voltage $(21/32)V_{ref}$ at the node e, and passes the digital code outputted at the start of the second comparison on to the latch circuit 16. The latch circuit 16 outputs the digital code "1011" via the terminals $17_1$ through $17_4$ as the conversion result of the analog voltage $AN_{in}$.

On the other hand, if $C_1=$"0" level and $C_2=C_3=$"1" level as a result of the second comparison, the control circuit 114 determines that the analog voltage $AN_{in}$ is lower than the comparison voltage $(21/32)V_{ref}$ at the node e, but higher than the comparison voltage $(19/32)V_{ref}$ at the node f, and changes the two digits of a low order, bit $2^{-3}$ and bit $2^{-4}$, of the digital code outputted at the start of the second comparison, to "10"; the thus changed digital code is supplied to the latch circuit 16. The latch circuit 16 outputs the digital code "1010" via the terminals $17_1$ through $17_4$ as the conversion result of the analog voltage $AN_{in}$.

Further, if $C_1=C_2=$"0" level and $C_3=$"1" level as a result of the second comparison, the control circuit 114 determines that the analog voltage $AN_{in}$ is lower than the comparison voltage $(19/32)V_{ref}$ at the node f, but higher than the comparison voltage $(17/32)V_{ref}$ at the node g, and changes the two digits of a low order, bit $2^{-3}$ and bit $2^{-4}$, of the digital code outputted at the start of the second comparison, to "01"; the thus changed digital code is supplied to the latch circuit 16. The latch circuit 16 outputs the digital code "1001" via the terminals $17_1$ through $17_4$ as the conversion result of the analog voltage $AN_{in}$.

If $C_1=C_2=C_3=$"0" level as a result of the second comparison, the control circuit 114 determines that the analog voltage $AN_{in}$ is lower than the comparison voltage $(17/32)V_{ref}$ at the node g, but higher than the comparison voltage $(15/32)V_{ref}$ at the node h, and changes the two digits of a low order, bit $2^{-3}$ and bit $2^{-4}$, of the digital code outputted at the start of the second comparison, to "00"; the thus changed digital code is supplied to the latch circuit 16. The latch circuit 16 outputs the digital code "1000" via the terminals $17_1$ through $17_4$ as the conversion result of the analog voltage $AN_{in}$.

In cases where the result of the first comparison corresponds to the state (3) or (4), the processing performed is fundamentally the same as described above. That is, the control circuit 114 supplies a digital code "0111" or "0011" to the analog multiplexer 12, which selects the comparison voltages taken from the nodes i, j, and k or the nodes m, n, and o and supplies the selected voltages to the respective comparators $13_1$ through $13_3$. The control circuit 114 selects a 4-bit digital code from Table 1 according to the states of the comparison result signals $C_1$ through $C_3$, and outputs the selected digital code through the latch circuit 16.

When the second comparison is completed and the latch circuit 16 finished outputting the 4-bit digital code via the terminals $17_1$ through $17_4$, the control circuit 114 outputs a conversion complete signal END via the control signal output terminal 18.

In the above-described analog/digital conversion circuit of the prior art, the analog input voltage is converted into an n-bit digital word using the comparison voltages taken at the nodes that divide the potential difference between the ground potential and the reference potential into $2^n$ ranges (n is a natural number). This leads to the problem that an analog voltage higher than the reference voltage cannot be accurately converted into digital values.

SUMMARY OF THE INVENTION

The present invention has been made to resolve the above problem, and it is an object of the invention to provide an analog/digital conversion circuit capable of accurately converting an analog voltage higher than the reference voltage into digital values.

The above and further objects and features of the invention will more fully be apparent from the following detailed description with accompanying drawings.

DESCRIPTION OF THE PREFERRED EMBODIMENTS

The present invention will be described in detail below with reference to the drawings illustrating the preferred embodiments.

EMBODIMENT 1

Figure 1:
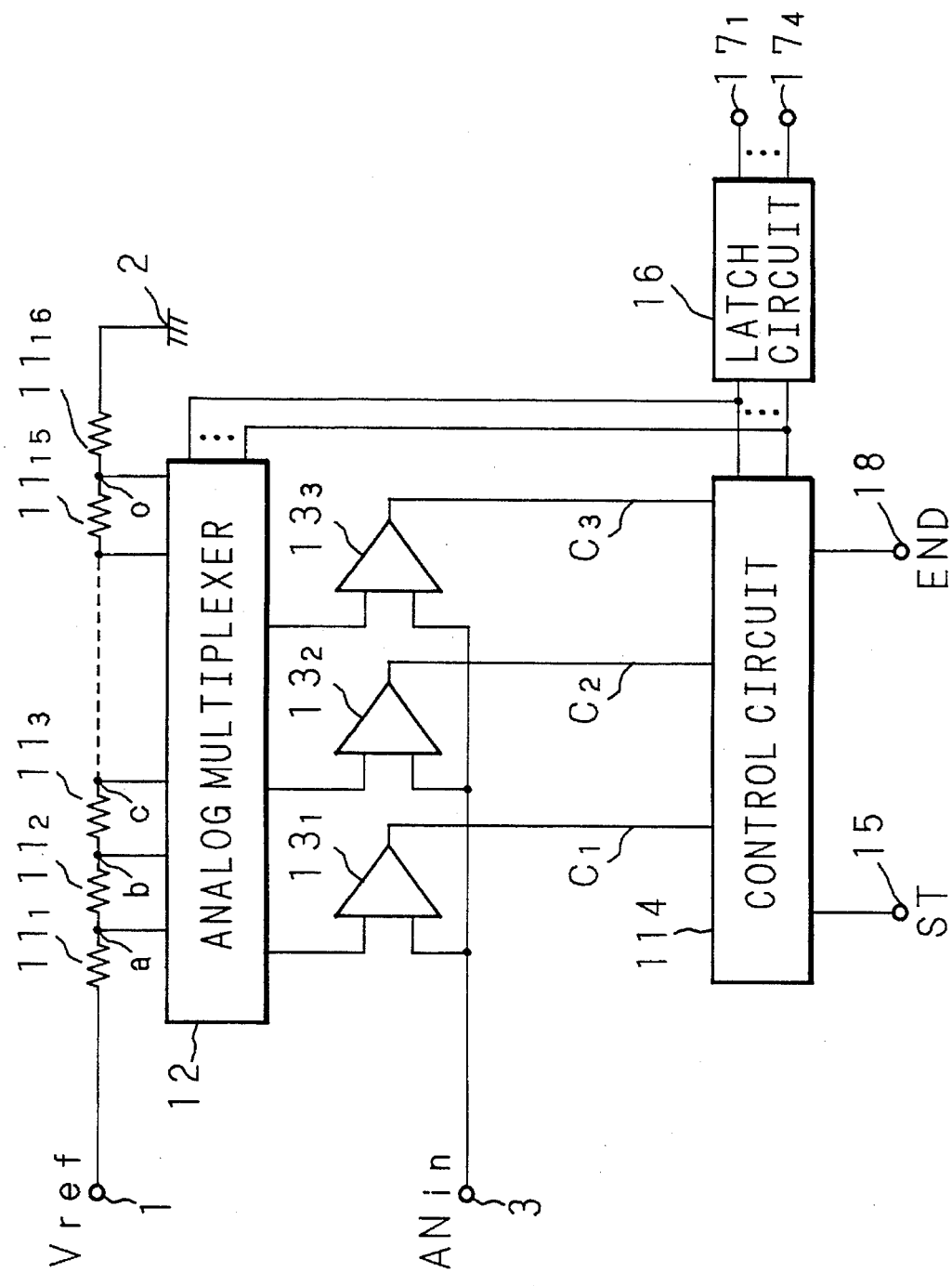
FIG. 1 is a block diagram showing the configuration of an analog/digital conversion circuit according to the prior art.
Figure 2:
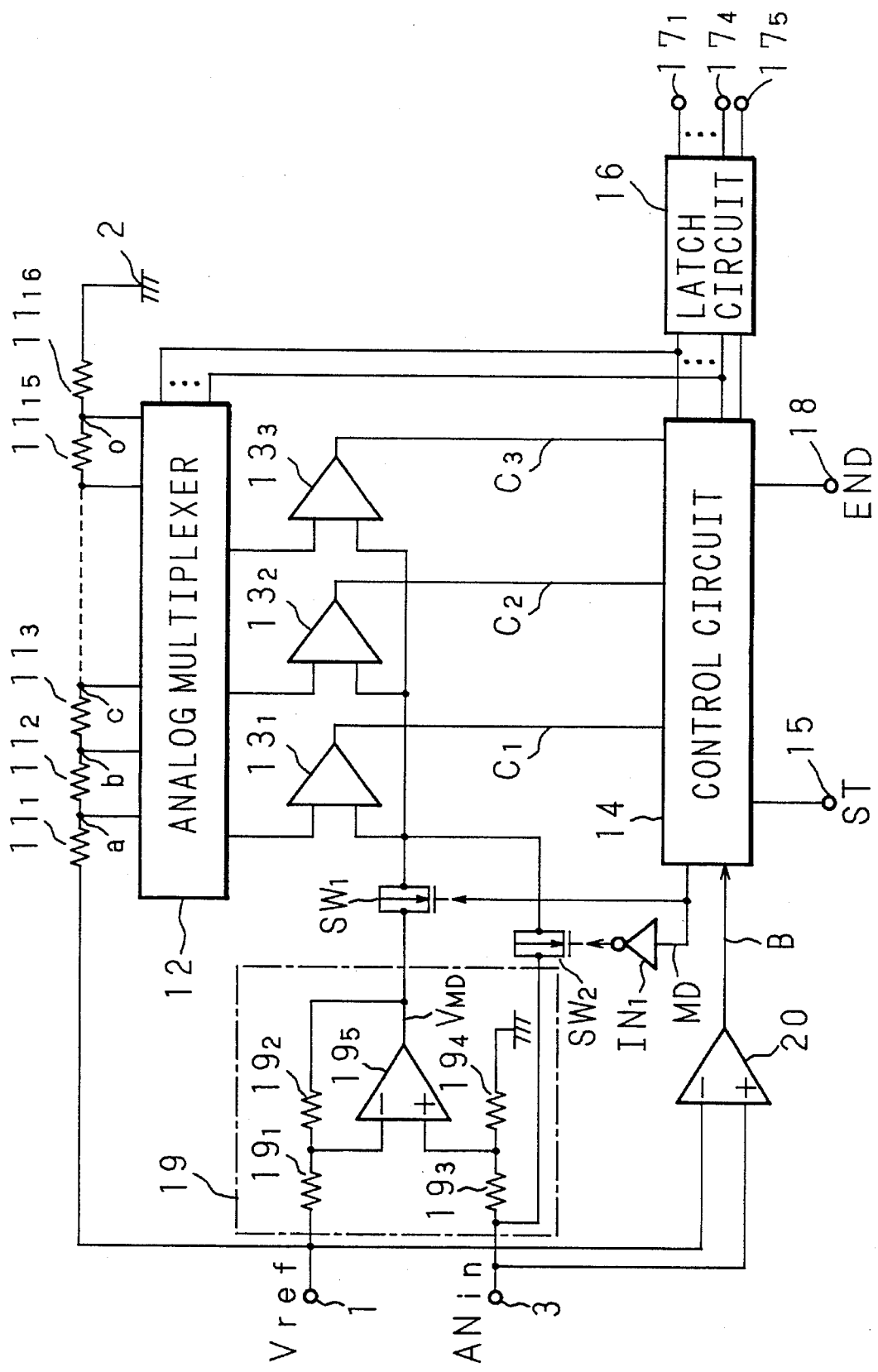
FIG. 2 is a block diagram showing the configuration of an analog/digital conversion circuit according t,o a first embodiment of the present invention.

FIG. 2 is a block diagram showing the configuration of an analog/digital conversion circuit according to a first Embodiment of the present invention. The analog/digital conversion circuit of this embodiment is basically a 4-bit resolution converter but has the function of expanding the resolution to 5 bits. Between a terminal 1 where a reference voltage $V_{ref}$ is applied, and a ground potential point 2, is interposed a series circuit consisting of a resistor $11_1$ with a resistance of 3R/2 (R is an appropriate resistance value), fourteen resistors $11_2$ through $11_{15}$ each with a resistance of R, and a resistor $11_{16}$ with a resistance of R/2. Divided voltages of the reference voltage $V_{ref}$ are obtained from nodes a through o along the series circuit of the resistors $11_1$ through $11_{16}$ as comparison voltages proportional to the number of resistors interposed between the reference voltage $V_{ref}$ and the respective nodes. The comparison voltages are supplied in parallel to an analog multiplexer 12 which selects three of the comparison voltages taken from the nodes a through o are to output, in accordance with a selection code and digital code supplied from a control circuit 14 for the first and second comparisons as will be described later.

The three comparison voltages selected by the analog multiplexer 12 are respectively applied to first input terminals of comparators $13_1$ through $13_3$. The reference voltage $V_{ref}$ is applied to a negative input terminal (−) of a voltage comparator 20 to whose positive input terminal (+) is applied an analog voltage $AN_{in}$ input via a terminal 3. The reference voltage $V_{ref}$ is also applied, via a resistor $19_1$, to a negative input terminal (−) of a zero-crossing differential amplifier $19_5$, while the analog voltage $AN_{in}$ is inputted to a positive input terminal (+) of the differential amplifier $19_5$ via a resistor $19_3$.

The negative input terminal (−) of the differential amplifier $19_5$ is connected to the output terminal thereof via a resistor $19_2$, while the positive input terminal (+) is grounded via a resistor $19_4$. The resistors $19_1$ through $19_4$ are chosen to have the same resistance (for example, RΩ). The differential amplifier $19_5$, together with the resistors $19_1$ through $19_4$, constitute a voltage adjusting section 19 that adjusts the analog voltage $AN_{in}$ to a voltage that can be converted to digital values using the reference voltage $V_{ref}$ by extracting the excess voltage of the analog voltage $AN_{in}$ over the reference voltage $V_{ref}$. The modified analog voltage $V_{MD}$ adjusted by the differential amplifier $19_5$ to a voltage digital-convertible with the reference voltage $V_{ref}$ is applied to the other input terminals of the comparators $13_1$ through $13_3$ via a switch circuit $SW_1$ constructed, for example, from a transfer gate.

On the other hand, the analog voltage $AN_{in}$ inputted via the terminal 3 is applied to the other input terminals of the comparators $13_1$ through $13_3$ through a switch circuit $SW_2$ constructed, for example, from a transfer gate. The voltage comparator 20 outputs a comparison result signal B after comparing the magnitude of the analog voltage $AN_{in}$ with that of the reference voltage $V_{ref}$ to the control circuit 14. Based on the comparison result signal B, the control circuit 14 outputs a voltage modifying signal MD which is at the "1" level if the analog voltage $AN_{in}$ is higher than the reference voltage $V_{ref}$, and at the "0" level if it is not higher than the reference voltage $V_{ref}$. The voltage modifying signal MD is supplied to the switch circuit $SW_1$ directly, and also to the switch circuit $SW_2$ via an inverter $IN_1$, and the switch circuits $SW_1$ and $SW_2$ are respectively turned on or off according to the state of the voltage modifying signal MD.

The comparators $13_1$ through $13_3$ compare the modified analog voltage $V_{MD}$ or the analog voltage $AN_{in}$ with the respective comparison voltages inputted from the analog multiplexer 12, and output comparison result signals $C_1$, $C_2$, and $C_3$, respectively, which are supplied in parallel to the control circuit 14. In response to an analog/digital conversion start signal ST externally applied to a control input terminal 15, the control circuit 14 supplies a digital code (selection code) to the analog multiplexer 12 to select the comparison voltages to be used for the first comparison whereby the analog voltage $AN_{in}$ inputted via the terminal 3 for digital conversion is sorted into one of four voltage ranges that substantially quadrisect the potential difference between the reference voltage and the ground potential.

Further, the control circuit 14 outputs a digital code according to the comparison result signals $C_1$ through $C_3$ supplied in parallel from the comparators $13_1$ through $13_3$, on receipt of the comparison result signals $C_9$ through $C_3$; in the second comparison, this digital code is supplied as a selection code to the analog multiplexer 12, and when the second comparison is completed, it is supplied as it is, or with some of its values changed, depending on the result of the second comparison, as a digital conversion result to a latch circuit 16. The latch circuit 16 temporarily holds the digital code supplied from the control circuit 14, and then outputs the code via output terminals $17_1$ through $17_4$. The comparison result signal B is passed unchanged through the control circuit 14 and inputted to the latch circuit 16 where it is held temporarily before being outputted as the MSB of a 5-bit digital code. At the completion of the analog/digital conversion, the control circuit 14 outputs a completion signal END via a control signal output terminal 18.

Next, the operation of the analog/digital conversion circuit having the above configuration will be described with reference to the previously given Table 1.

In response to the conversion start signal ST applied to the control input terminal 15, the control circuit 14 automatically outputs to the analog multiplexer 12 for the first comparison, a 4-bit selection code, "$2^{-1}$, $2^{-2}$, $2^{-3}$, $2^{-4}$"= "1100", corresponding to the node d out of the nodes d, h, and l that substantially quadrisect the potential difference between the reference voltage and the ground potential. When the digital code "1100" is inputted, the analog multiplexer 12 selects the comparison voltages $(23/32)V_{ref}$, $(15/32)V_{ref}$, and $(7/32)V_{ref}$ respectively taken from the node d corresponding to the digital code "1100" and the other two nodes h and l (not shown in FIG. 2), and respectively supplies the selected comparison voltages to the first input terminals of the comparators $13_1$ through $13_3$. When the analog voltage $AN_{in}$ to be converted into digital values, or the modified analog voltage $V_{MD}$ adjusted to a voltage digital-convertible with the reference voltage $V_{ref}$, is inputted to the other terminals of the comparators $13_1$ through $13_3$ according to the on/off states of the switch circuits $SW_1$ and $SW_2$ controlled by the control circuit 14 as will be described later, the comparators $13_1$ through $13_3$ perform the first comparison of the analog voltage $AN_{in}$ or the modified analog voltage $V_{MD}$ with the respective comparison voltages, and supply the respective comparison result signals $C_1$ through $C_3$ to the control circuit 14.

The control circuit 14 decides to apply in the following manner whether the analog voltage $AN_{in}$ or the modified analog voltage $V_{MD}$ to the other input terminals of the comparators $13_1$ through $13_3$. When the reference voltage $V_{ref}$ and the analog voltage $AN_{in}$ are inputted, the voltage comparator 20 compares the magnitude between the reference voltage $V_{ref}$ and the analog voltage $AN_{in}$.

When $V_{ref} > AN_{in}$, the voltage comparator 20 outputs a "0" level comparison result signal B to the control circuit 14. The control circuit 14 outputs a "0" level voltage modifying signal MD in response to the "0" level comparison result signal B. The "0" level voltage modifying signal MD is applied to the switch circuit $SW_1$ directly, while the "1" level voltage modifying signal MD inverted by the inverter $IN_1$ which is applied to the switch circuit $SW_2$.

As a result, only the switch circuit $SW_2$ is turned on, so that the analog voltage $AN_{in}$ is applied to the other input terminals of the comparators $13_1$ through $13_3$. That is, when $V_{ref} > AN_{in}$, the analog voltage $AN_{in}$ is inputted directly to the comparators $13_1$ through $13_3$. On the other hand, the "0" level comparison result signal B inputted to the control circuit 14 is transferred unchanged to the latch circuit 16 and outputted from the latch circuit 16 via the terminal $17_5$ as the MSB of a 5-bit digital code.

Next, when $V_{ref} < AN_{in}$, the voltage comparator 20 outputs a "1" level comparison result signal B to the control circuit 14. The control circuit 14 outputs a "1" level voltage modifying signal MD in response to the "1" level comparison result signal B. The "1" level voltage modifying signal MD is supplied to the switch circuit $SW_1$ directly. The "1" level voltage modifying signal MD fed into the inverter $IN_1$ is inverted into the "0" level voltage modifying signal MD which is applied to the switch circuit $SW_2$.

As a result, only the switch circuit $SW_1$ is turned on, so that the modified analog voltage $V_{MD}$ outputted from the differential amplifier $19_5$ is applied to the other input terminals of the comparators $13_1$ through $13_3$. That is, when $V_{ref} < AN_{in}$, the modified analog voltage $V_{MD}$, which is the difference between the analog voltage $AN_{in}$ and the reference voltage $V_{ref}$ and is digital-convertible with the reference voltage $V_{ref}$, is inputted to the comparators $13_1$ through $13_3$. On the other hand, the "1" level comparison result signal B inputted to the control circuit 14 is transferred unchanged to the latch circuit 16 and outputted from the latch circuit 16 via the terminal $17_5$ as the MSB of a 5-bit digital code.

When the modified analog voltage $V_{MD}$ or the analog voltage $AN_{in}$ is inputted to the other input terminals of the comparators $13_1$ through $13_3$ in this manner, the comparators $13_1$ through $13_3$ perform the first comparison with the respective comparison voltages inputted from the analog multiplexer 12.

When it is assumed that, the comparators $13_1$ through $13_3$ output the comparison result signals $C_1$ through $C_3$ of the "1" level if the modified analog voltage $V_{MD}$ or the analog voltage $AN_{in}$ is higher than the respective comparison voltages, one of the following four states is obtained for the comparison result signals $C_1$ through $C_3$ according to whether the modified analog voltage $V_{MD}$ or the analog voltage $AN_{in}$ is higher than the respective comparison voltages.

(1) $C_1 = C_2 = C_3 =$ "1" level
(2) $C_1 =$ "0" level, $C_2 = C_3 =$ "1" level
(3) $C_1 = C_2 =$ "0" level, $C_3 =$ "1" level
(4) $C_1 = C_2 = C_3 =$ "0" level Let us assume here that when the modified analog voltage $V_{MD}$ or the analog voltage $AN_{in}$ is higher than the respective comparison voltages outputted from the analog multiplexer 12, the comparators $13_1$ through $13_3$ respectively output the comparison result signals $C_1$ through $C_3$ of the "1" level. Then, the result of the first comparison takes one of the following four states, (1), (2), (3), or (4), according to the magnitude of the modified analog voltage $V_{MD}$ or the analog voltage $AN_{in}$.

First, we will describe the case where the result of the first comparison corresponds to the state (1). When the modified analog voltage $V_{MD}$ or the analog voltage $AN_{in}$ is higher than the comparison voltage $(23/32)V_{ref}$ taken at the node d, the control circuit 14 outputs to the analog multiplexer 12 for the second comparison, a 4-bit selection code "1111" corresponding to the node a ou of the nodes a, b, and c that substantially quadrisect the potential difference between the reference voltage and the comparison voltage $(23/32)V_{ref}$ at the node d. When this digital code is inputted, the analog multiplexer 12 selects the comparison voltages $(29/32)V_{ref}$, $(27/32)V_{ref}$, and $(25/32)V_{ref}$ respectively taken from the node a corresponding to the digital code "1111", and the other two nodes b and c, and supplies the selected comparison voltages to the respective comparators $13_1$ through $13_3$.

Then, the comparators $13_1$ through $13_3$ perform the second comparison of the modified analog voltage $V_{MD}$ or the analog voltage $AN_{in}$ with the respective comparison voltages.

In the second comparison, as in the first comparison, one of the above four states is obtained for the comparison result signals $C_1$ through $C_3$ according to whether the modified analog voltage $V_{MD}$ or the analog voltage $AN_{in}$ is higher than the respective comparison voltages. As a result of the second comparison, if the comparison result signals $C_1$ through $C_3$ are all at the "1" level, the control circuit 14 determines that the modified analog voltage $V_{MD}$ or the analog voltage $AN_{in}$ is higher than the comparison voltage $(29/32)V_{ref}$ at the node a, and passes the digital code outputted at the start of the second comparison on to the latch circuit 16. The latch circuit 16 outputs the digital code "1111" via the terminals $17_1$ through $17_4$ as the conversion result of the modified analog voltage $V_{MD}$ or the analog voltage $AN_{in}$.

On the other hand, if $C_1 =$ "0" level and $C_2 = C_3 =$ "1" level as a result of the second comparison, the control circuit 14 determines that the modified analog voltage $V_{MD}$ or the analog voltage $AN_{in}$ is lower than the comparison voltage $(29/32)V_{ref}$ at the node a, but higher than the comparison voltage $(27/32)V_{ref}$ at the node b, and changes the two digits of a low order, bit $2^{-3}$ and bit $2^{-4}$, of the digital code outputted at the start of the second comparison, to "10"; the thus changed digital code is supplied to the latch circuit 16. The latch circuit. 16 outputs the digital code "1110" via he terminals $17_1$ through $17_4$ as the conversion result of the modified analog voltage $V_{MD}$ or the analog voltage $AN_{in}$.

Further, if $C_1=C_2=$"0" level and $C_3=$"1" level as a result of the second comparison, the control circuit 14 determines that the modified analog voltage $V_{MD}$ or the analog voltage $AN_{in}$ is lower than the comparison voltage $(27/32)V_{ref}$ at the node b, but higher than the comparison voltage $(25/32)V_{ref}$ at the node c, and changes the two digits of a low order, bit $2^{-3}$ and bit $2^{-4}$ of the digital code outputted at the start of the second comparison, to "01"; the thus changed digital code is supplied to the latch circuit 16. The latch circuit 16 outputs the digital code "1101" via the terminals $17_1$ through $17_4$ as the conversion result of the modified analog voltage $V_{MD}$ or the analog voltage $AN_{in}$.

If $C_1=C_2=C_3=$"0" level as a result of the second comparison, the control circuit 14 determines that the modified analog voltage $V_{MD}$ or the analog voltage $AN_{in}$ is lower than the comparison voltage $(25/32)V_{ref}$ at the node c, but higher than the comparison voltage $(23/32)V_{ref}$ at the node d, and changes the two digits of a low order, bit $2^{-3}$ and bit $2^{-4}$, of the digital code outputted at the start of the second comparison, to "00"; the thus changed digital code is supplied to the latch circuit 16. The latch circuit 16 outputs the digital code "1100" via the terminals $17_1$ through $17_4$ as the conversion result of the modified analog voltage $V_{MD}$ or the analog voltage $AN_{in}$.

Next, we will describe the case where the result of the first comparison corresponds to the state (2). When $C_1=$"0" level and $C_2=$"1" level, that is, when the modified analog voltage $V_{MD}$ or the analog voltage $AN_{in}$ is lower than the comparison voltage $(23/32)V_{ref}$ at the node d, but higher than the comparison voltage $(15/32)V_{ref}$ at the node h, the control circuit 14 outputs to the analog multiplexer 12 for the second comparison, a 4-bit selection code "1011" corresponding to the node e out of the nodes e, f, and g that substantially quadrisect the potential difference between the comparison voltage $(23/32)V_{ref}$ at the node d and the comparison voltage $(15/32)V_{ref}$ at the node h. When this digital code is inputted, the analog multiplexer 12 selects the comparison voltages $(21/32)V_{ref}$, $(19/32)V_{ref}$, and $(17/32)V_{ref}$ respectively taken, from the node e corresponding to the digital code "1011" and the other two nodes f and g, and supplies the selected comparison voltages to the respective comparators $13_1$ through $13_3$.

Then, the comparators $13_1$ through $13_3$ perform the second comparison of the modified analog voltage $V_{MD}$ or the analog voltage $AN_{in}$ with the respective comparison voltages.

As a result of the second comparison, if the comparison result signals $C_1$ through $C_3$ are all at the "1" level, the control circuit 14 determines that the modified analog voltage $V_{MD}$ or the analog voltage $AN_{in}$ is higher than the comparison voltage $(21/32)V_{ref}$ at the node e, and passes the digital code outputted at the start of the second comparison on to the latch circuit 16. The latch circuit, 16 outputs the digital code "1011" via the terminals $17_1$ through $17_4$ as the conversion result, of the modified analog voltage $V_{MD}$ or the analog voltage $AN_{in}$.

On the other hand, if $C_1=$"0" level and $C_2=C_3=$"1" level as a result of the second comparison, the control circuit 14 determines that the modified analog voltage $V_{MD}$ or the analog voltage $AN_{in}$ is lower than the comparison voltage $(21/32)V_{ref}$ at the node e, but higher than the comparison voltage $(19/32)V_{ref}$ at the node f, and changes the two digits of a low order, bit $2^{-3}$ and bit $2^{-4}$, of the digital code outputted at the start of the second comparison, to "10"; the thus changed digital code is supplied to the latch circuit 16. The latch circuit 16 outputs the digital code "1010" via the terminals $17_1$ through $17_4$ as the conversion result of the modified analog voltage $V_{MD}$ or the analog voltage $AN_{in}$.

Further, if $C_1=C_2=$"0" level and $C_3=$"1" level as a result of the second comparison, the control circuit 14 determines that the modified analog voltage $V_{MD}$ or the analog voltage $AN_{in}$ is lower than the comparison voltage $(19/32)V_{ref}$ at the node f, but higher than the comparison voltage $(17/32)V_{ref}$ at the node g, and changes the two digits of a low order, bit $2^{-3}$ and bit $2^{-4}$, of the digital code outputted at the start of the second comparison, to "01"; the thus changed digital code is supplied to the latch circuit 16. The latch circuit 16 outputs the digital code "1001" via the terminals $17_1$ through $17_4$ as the conversion result of the modified analog voltage $V_{MD}$ or the analog voltage $AN_{in}$.

If $C_{1=C2}=C_3=$"0" level as a result of the second comparison, the control circuit 14 determines that the modified analog voltage $V_{MD}$ or the analog voltage $AN_{in}$ is lower than the comparison voltage $(17/32)V_{ref}$ at the node g, but higher than the comparison voltage $(15/32)V_{ref}$ at the node h, and changes the two digits of a low order, bit $2^{-3}$ and bit $2^{-4}$, of the digital code outputted at the start of the second comparison, to "00"; the thus changed digital code is supplied to the latch circuit 16. The latch circuit 16 outputs the digital code "1000" via the terminals $17_1$ through $17_4$ as the conversion result of the modified analog voltage $V_{MD}$ or the analog voltage $AN_{in}$.

In cases where the result of the first comparison corresponds to the state (3) or (4), the processing performed is fundamentally the same as described above. That is, the control circuit 14 supplies a digital code "0111" or "0011" to the analog multiplexer 12, which selects the comparison voltages taken from the nodes i, j, and k or the nodes m, n, and o and supplies the selected voltages to the respective comparators $13_1$ through $13_3$. The control circuit 14 selects a 4-bit digital code from Table 1 according to the states of the comparison result signals $C_1$ through $C_3$, and outputs the selected digital code through the latch circuit 16.

The comparison result signal B outputted from the voltage comparator 20 is passed unchanged through the control circuit 14 and inputted to the latch circuit 16 which temporarily holds its digital value before outputting it via the terminal $17_5$ as the MSB of a 5-bit digital code. As a result, the digital code corresponding to the analog voltage $AN_{in}$ is output via the terminals $17_1$ through $17_5$. When the second comparison is completed and the latch circuit 16 has finished outputting the 4-bit digital code via the terminals $17_1$ through $17_4$, the control circuit 14 outputs a conversion complete signal END via the control signal output terminal 18.

As described, even when the analog voltage $AN_{in}$ exceeds the reference voltage $V_{ref}$, the modified analog voltage $V_{MD}$, which represents the difference between the analog voltage $AN_{in}$ and the reference voltage $V_{ref}$ and is not higher than the reference voltage $V_{ref}$, is inputted to the comparators $13_1$ through $13_3$, and the excess voltage is converted into digital value, while at the same time, the digital value of the digit one place up the highest digit place of the bits digital-convertible with the reference voltage $V_{ref}$ is set to be 1(one). In this manner, the analog voltage $AN_{in}$ exceeding the reference voltage $V_{ref}$ can be converted accurately into digital values.

EMBODIMENT 2

Figure 3:
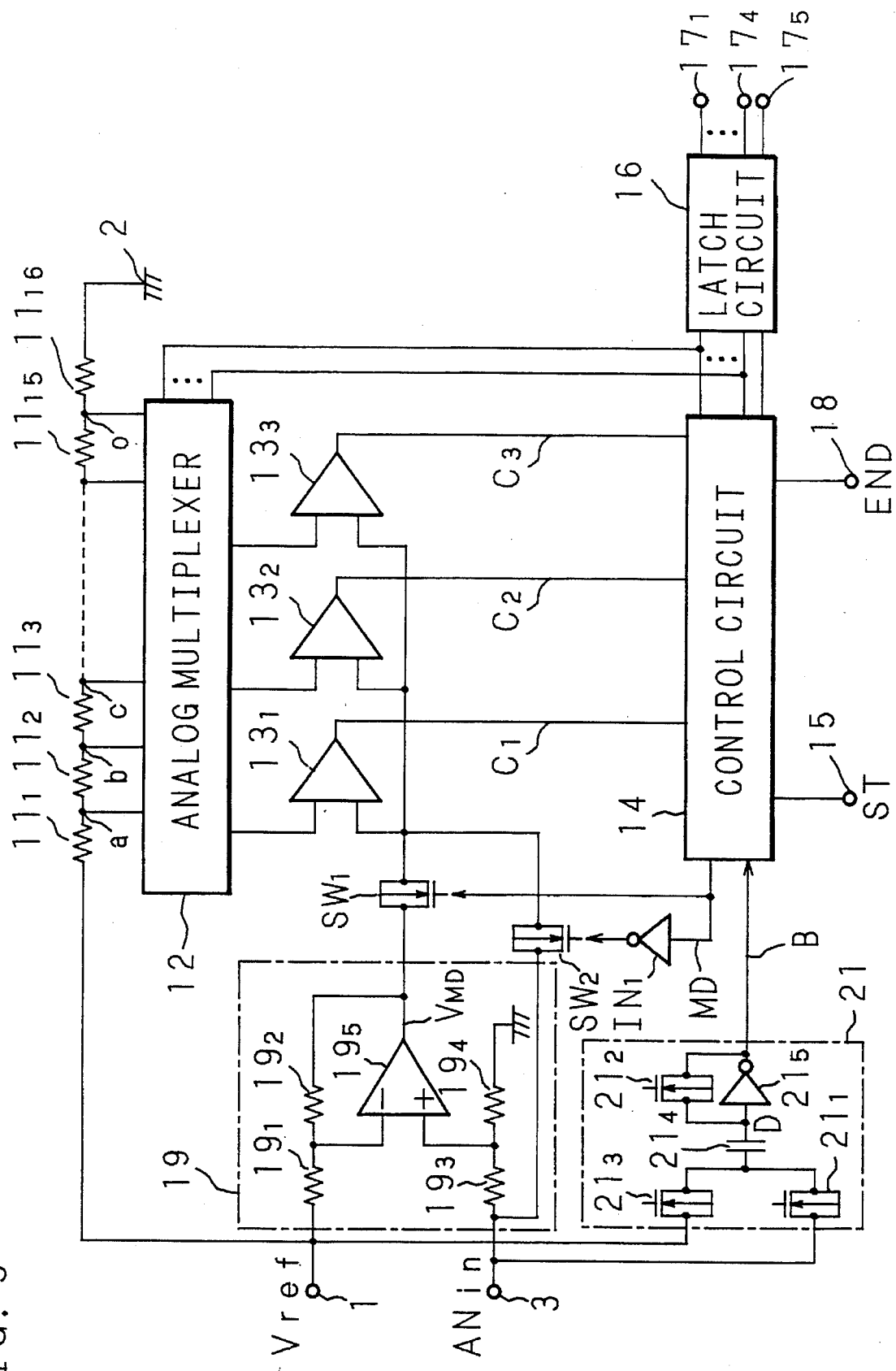
FIG. 3 is a block diagram showing the configuration of an analog/digital conversion circuit according to a second embodiment of the present invention.

FIG. 3 is a block diagram showing the configuration of an analog/digital conversion circuit according to a second embodiment of the invention. The same parts as those in the first embodiment shown in FIG. 2 are designated by the same reference numerals, and description of such parts will be omitted here. The difference between the present embodiment and the first embodiment is in the design of a voltage comparing section 21.

The reference voltage $V_{ref}$ is applied to one plate of a capacitor $21_4$ via a switch circuit $21_3$, while the analog voltage $AN_{in}$ is applied to the same plate of the capacitor $21_4$ via a switch circuit $21_1$. The voltage appearing at the other plate of the capacitor $21_4$ is coupled to the control circuit 14 via an inverter $21_5$ which is a chopper amplifier. The voltage at the other plate of the capacitor $21_4$ is also coupled to the control circuit 14 via a switch circuit $21_2$. The switch circuits $21_1$ through $21_3$ are constructed, for example, from transfer gates.

The switch circuits $21_1$ through $21_3$, the capacitor $21_4$, and the inverter $21_5$ together constitute the voltage comparing section 21. Using a control signal fed from the control circuit 14 via a control signal line not shown, the switch circuits $21_1$ and $21_2$ are turned on or off simultaneously, while the switch circuit $21_3$ is complementarily turned on or off with the switch circuits $21_1$ and $21_2$.

Next, the operation of the analog/digital conversion circuit of the present embodiment will be described below.

When the conversion start signal ST is given to the control circuit 14 via the control signal input terminal 15, the control circuit 14 outputs a control signal to turn on the switch circuits $21_1$ and $21_2$ and to turn off the switch circuit, $21_3$. As a result, the analog voltage $AN_{in}$ is applied to the capacitor $21_4$ which is then charged.

After a prescribed time passes, the control circuit 14 turns off the switch circuits $21_1$ and $21_2$ and turns on the switch circuit $21_3$, so that the reference voltage $V_{ref}$ is now applied to the capacitor $21_4$. The potential at a node D of the capacitor $21_4$ rises or falls depending on whether the reference voltage $V_{ref}$ is higher or lower than the analog voltage $V_{in}$, whereby the magnitudes of the reference voltage $V_{ref}$ and the analog voltage $V_{in}$ are compared. When $V_{ref} > AN_{in}$, the output of the inverter $21_5$, i.e. the voltage comparison result signal B, becomes the "0" level; when $V_{ref} < AN_{in}$, the output of the inverter $21_5$, i.e. the voltage comparison result signal B, becomes the "1" level.

As in the first embodiment, the control circuit 14 outputs the voltage modifying signal MD responsive to the comparison result signal B. When $V_{ref} > AN_{in}$, the analog voltage $AN_{in}$ is selected, and when $V_{ref} < AN_{in}$, the modified analog voltage $V_{MD}$ is selected to be inputted to the comparators $13_1$ through $13_3$ where the modified analog voltage $V_{MD}$ or the analog voltage $AN_{in}$ is compared with the respective comparison voltages, thereby performing digital conversion in the same manner as in the first embodiment.

In the present embodiment, as in the first embodiment, even the analog voltage $AN_{in}$ exceeding the reference voltage $V_{ref}$ can be converted accurately into digital values.

EMBODIMENT 3

Figure 4:
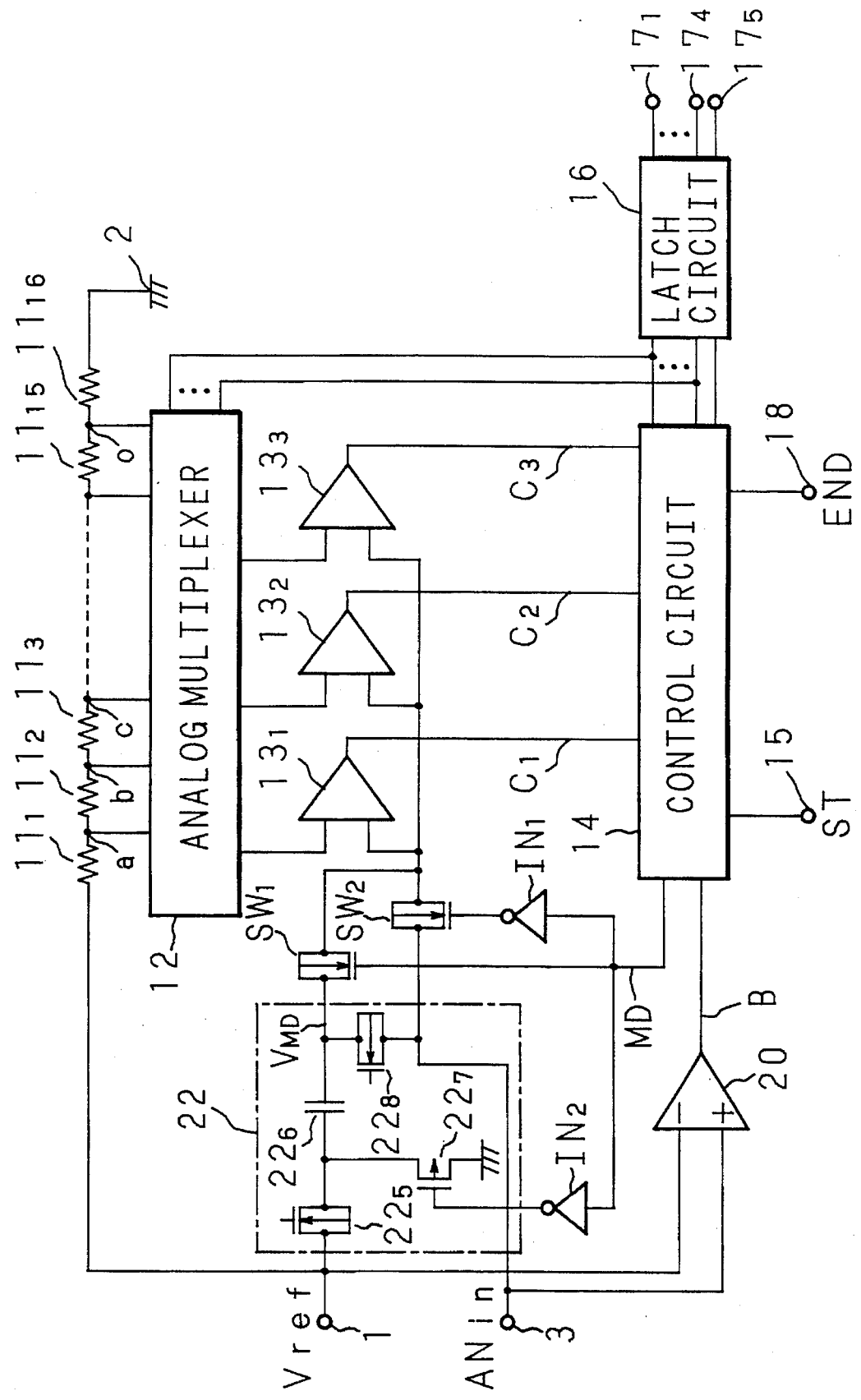
FIG. 4 is a block diagram showing the configuration of an analog/digital conversion circuit according to a third embodiment of the present invention.

FIG. 4 is a block diagram showing the configuration of an analog/digital conversion circuit according to a third embodiment of the invention. The same parts as those in the first embodiment shown in FIG. 2 are designated by the same reference numerals, and description of such parts will be omitted here. The difference between the present embodiment and the first embodiment is in the design of a voltage adjusting section 22.

The reference voltage $V_{ref}$ is applied to one plate of a capacitor $22_6$ via a switch circuit $22_5$. That one plate of the capacitor $22_6$ is grounded via a switch circuit $22_7$. The analog voltage $AN_{in}$ is applied to the other plate of the capacitor $22_6$ via a switch circuit $22_8$, and also to the switch circuit $SW_2$ directly. The voltage appearing at the other plate of the capacitor $22_6$ is applied to the switch circuit $SW_1$ as the modified analog voltage $V_{MD}$. The voltage modifying signal MD outputted from the control circuit 14 is also supplied to the switch circuit $22_7$ via an inverter $IN_2$. The switch circuits $22_5$ and $22_8$ are constructed, for example, from transfer gates, and the switch circuit. $22_7$, for example, from an FET.

The switch circuits $22_5$, $22_7$, $22_8$, and the capacitor $22_6$ together constitute the voltage adjusting section 22. The switch circuits $22_5$ and $22_8$ are simultaneously turned on or off by a control signal fed from the control circuit 14 via a control signal line not shown.

Next, the operation of the analog/digital conversion circuit of the present embodiment will be described below.

When the conversion start signal ST is given to the control circuit 14 via the control signal input terminal 15, the control circuit 14 outputs a control signal to turn on the switch circuits $22_5$ and $22_8$. As a result, the reference voltage $V_{ref}$ and the analog voltage $AN_{in}$ are respectively applied to the one and the other plates of the capacitor $22_6$, and the capacitor $22_6$ is charged by the voltage difference between the reference voltage $V_{ref}$ and the analog voltage $AN_{in}$.

At the same time, the voltage comparator 20 compares the magnitude between the reference voltage $V_{ref}$ and the analog voltage $AN_{in}$. When $V_{ref} > AN_{in}$, a "0" level comparison result signal B is inputted to the control circuit 14 from the voltage comparator 20. In response to this comparison result signal B, the control circuit 14 outputs a "0" level voltage modifying signal MD to turn off the two switch circuits $22_7$ and $SW_1$ and to turn on the switch circuit $SW_2$, so that the analog voltage $AN_{in}$ is applied to the comparators $13_1$ through $13_3$.

On the other hand, when $V_{ref} < AN_{in}$, a "1" level comparison result signal B is inputted to the control circuit 14 from the voltage comparator 20. In response to this comparison result signal B, the control circuit 14 outputs a "1" level voltage modifying signal MD to turn on the switch circuits $22_7$ and $SW_1$ and to turn off the switch circuits $22_5$, $22_8$, and $SW_2$. As a result, the potential at the one plate of the capacitor $22_6$ falls to the ground potential, and the voltage difference between the analog voltage $AN_{in}$ and the reference voltage $V_{ref}$, with which the capacitor $22_6$ has been charged, is input as the modified analog voltage $V_{MD}$ to the comparators $13_1$ through $13_3$ via the switch circuit $SW_1$.

In the above manner, the modified analog voltage $V_{MD}$ is generated that represents the difference between the analog voltage $AN_{in}$ and the reference voltage $V_{ref}$ and that is not higher than the reference voltage $V_{ref}$. Thus, in the present embodiment, as in the first embodiment, even the analog voltage $AN_{in}$ exceeding the reference voltage $V_{ref}$ can be converted accurately into digital values.

EMBODIMENT 4

Figure 5:
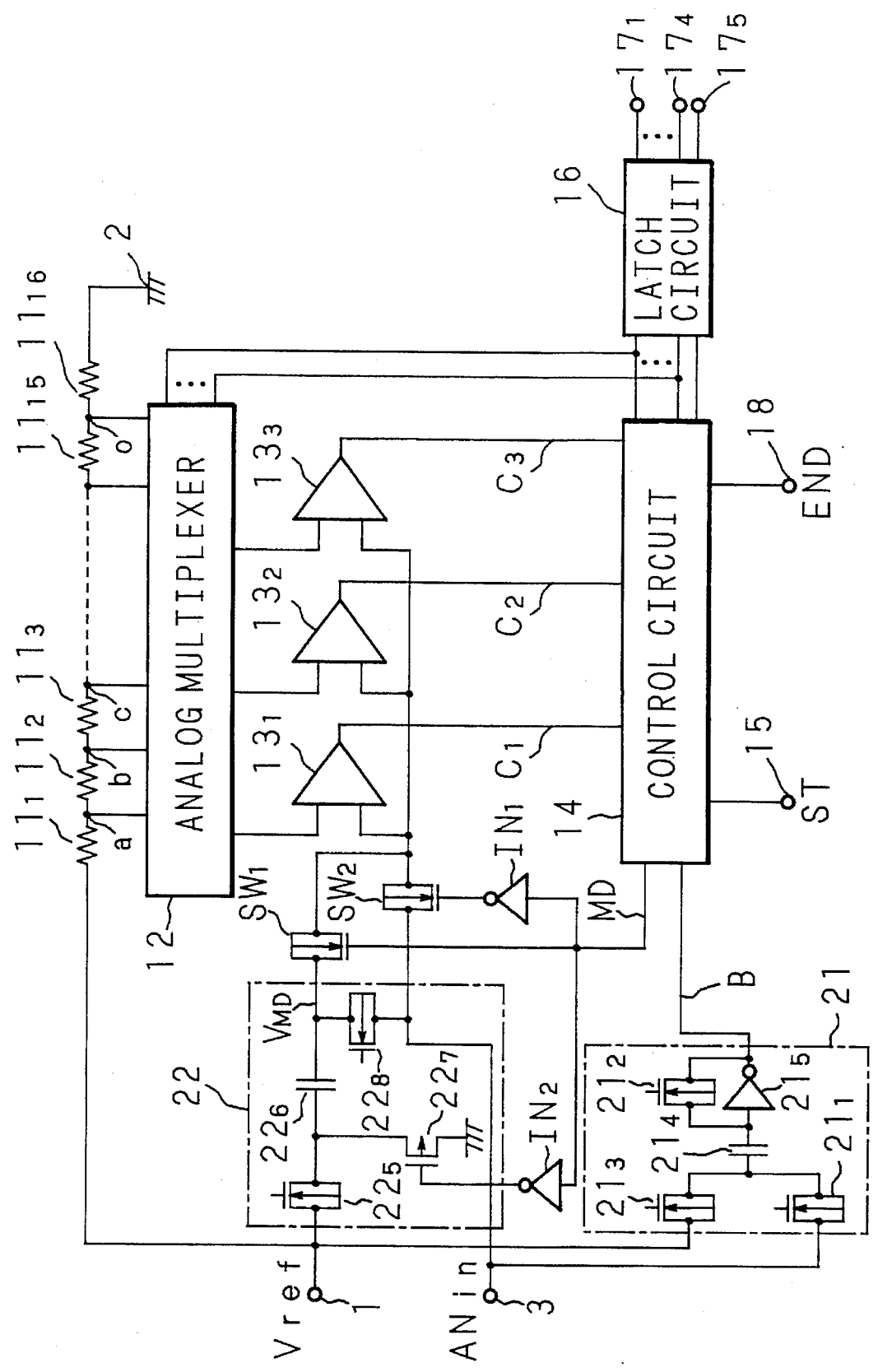
FIG. 5 is a block diagram showing the configuration of an analog/digital conversion circuit according to a fourth embodiment of the present invention.

FIG. 5 is a block diagram showing the configuration of an analog/digital conversion circuit according to a fourth embodiment of the invention. This embodiment incorporates the voltage comparing section 21 of the second embodiment shown in FIG. 3 and the voltage adjusting section 22 of the third embodiment shown in FIG. 4. The same parts as those shown in FIGS. 3 and 4 are designated by the same reference numerals.

In the analog/digital conversion circuit of the present embodiment, the voltage adjusting section 22 functions in the same manner as the voltage adjusting section 22 of the third embodiment, and outputs the modified analog voltage $V_{MD}$ that is the difference voltage between the reference voltage $V_{ref}$ and the analog voltage $AN_{in}$. Likewise, the voltage comparing section 21 functions in the same manner as the voltage comparing section 21 of the second embodiment shown in FIG. 3. Accordingly, in the analog/digital conversion circuit of the present embodiment also selects the modified analog voltage $V_{MD}$ when $AN_{in} > V_{ref}$, or the analog voltage $AN_{in}$ when $AN_{in}$ 21 $V_{ref}$ as an input to the comparators $13_1$ through $13_3$, thereby to perform analog-to-digital conversion in the same manner as in the foregoing embodiments. Even the analog voltage exceeding the reference voltage can thus be converted accurately to digital values.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

TABLE 1

| node | comparison voltage | digital code | | | |
|---|---|---|---|---|---|
| | | $2^{-1}$ | $2^{-2}$ | $2^{-3}$ | $2^{-4}$ |
| a | 29/32 Vref | 1 | 1 | 1 | 1 |
| b | 27/32 Vref | 1 | 1 | 1 | 0 |
| c | 25/32 Vref | 1 | 1 | 0 | 1 |
| d | 23/32 Vref | 1 | 1 | 0 | 0 |
| e | 21/32 Vref | 1 | 0 | 1 | 1 |
| f | 19/32 Vref | 1 | 0 | 1 | 0 |
| g | 17/32 Vref | 1 | 0 | 0 | 1 |
| h | 15/32 Vref | 1 | 0 | 0 | 0 |
| i | 13/32 Vref | 0 | 1 | 1 | 1 |
| j | 11/32 Vref | 0 | 1 | 1 | 0 |
| k | 9/32 Vref | 0 | 1 | 0 | 1 |
| l | 7/32 Vref | 0 | 1 | 0 | 0 |
| m | 5/32 Vref | 0 | 0 | 1 | 1 |
| n | 3/32 Vref | 0 | 0 | 1 | 0 |
| o | 1/32 Vref | 0 | 0 | 0 | 1 |
| | | 0 | 0 | 0 | 0 |

What is claimed is:

1. An analog/digital conversion circuit, comprising:

voltage comparing means for comparing a voltage to be converted with a reference voltage;

voltage adjusting means for adjusting the voltage to be converted, to a voltage that can be digital converted using said reference voltage by extracting an excess voltage when the voltage to be converted is higher than said reference voltage as a result of the comparison by said voltage comparing means;

digital converting means for converting the voltage to be converted or the excess voltage to digital values by comparing the voltage to be converted or the excess voltage with a comparison voltage derived by dividing said reference voltage; and control means for supplying to said digital converting means, as a result of the comparison by said voltage comparing means, the voltage to be converted when the voltage to be converted is not higher than said reference voltage, or the excess voltage when the voltage to be converted is higher than said reference voltage, and for setting a digital value of one place up the highest digit place of the digital values obtained from the comparison between the excess voltage and the comparison voltage, to be 1(one) when the voltage to be converted is higher than said reference voltage.

2. An analog/digital conversion circuit according to claim 1, wherein said voltage comparing means is a comparator.

3. An analog/digital conversion circuit according to claim 1, wherein said voltage adjusting means comprises a differential amplifier that outputs the difference voltage between said reference voltage and the voltage to be converted, and resistors each is interposed between an input terminal of said differential amplifier and an input terminal via which said reference voltage is inputted, between an input terminal of said differential amplifier and an input terminal via which the voltage to be converted is inputted, between one of said input terminals of said differential amplifier and an output terminal thereof, or between said differential amplifier and ground potential.

4. An analog/digital conversion circuit according to claim 1, wherein said voltage comparing means comprises a capacitor, switch circuits complementarily closed at prescribed intervals and, when the one thereof being closed, apply said reference voltage or the voltage to be converted to one plate of said capacitor at prescribed intervals, and means for detecting whether the voltage to be converted is higher than said reference voltage according to an increase or decrease in the voltage at a node with the other plate of said capacitor caused by said switch circuits being complementarily closed at prescribed intervals, and said control means includes means for complementarily closing said switch circuits at prescribed intervals.

5. An analog/digital conversion circuit according to claim 1, wherein said voltage adjusting means comprises a capacitor, a first switch circuit applies said reference voltage to one plate of said capacitor then being closed, a second switch circuit applies the voltage to be converted to the other plate of said capacitor when being closed, and a third switch circuit interposed between said one plate of the capacitor and ground potential and causes the potential at said one plate to drop to the ground potential when being closed, and said control means includes means for simultaneously closing said first and second switch circuits, and means for supplying the excess voltage accumulated in said capacitor to said digital converting means by closing said third switch when the voltage to be converted exceeds said reference voltage.

* * * * *